United States Patent
Brauch et al.

(10) Patent No.: US 6,550,023 B1
(45) Date of Patent: Apr. 15, 2003

(54) ON-THE-FLY MEMORY TESTING AND AUTOMATIC GENERATION OF BITMAPS

(75) Inventors: Jeffery C. Brauch, Fort Collins, CO (US); Jay E. Fleischman, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/175,010

(22) Filed: Oct. 19, 1998

(51) Int. Cl.⁷ .................................................. G06F 11/00
(52) U.S. Cl. ........................ 714/42; 714/733; 714/719; 714/57
(58) Field of Search .............................. 714/25, 32, 36, 714/42, 45, 47, 53, 54, 57, 719, 723, 733

(56) References Cited

U.S. PATENT DOCUMENTS

| | | | | |
|---|---|---|---|---|
| 3,579,199 A | * | 5/1971 | Anderson et al. | 714/25 |
| 5,640,509 A | * | 6/1997 | Balmer et al. | 714/42 |
| 5,673,270 A | * | 9/1997 | Tsujimoto | 365/189.01 |
| 5,818,772 A | * | 10/1998 | Kuge | 714/719 |
| 5,961,657 A | * | 10/1999 | Park et al. | 714/718 |
| 5,974,579 A | * | 10/1999 | Lepejian et al. | 365/201 |
| 5,982,681 A | * | 11/1999 | Schwarz | 365/201 |
| 6,085,346 A | * | 7/2000 | Lepejian et al. | 714/724 |
| 6,148,426 A | * | 11/2000 | Kim et al. | 714/730 |
| 6,154,861 A | * | 11/2000 | Harward | 714/719 |
| 6,182,257 B1 | * | 1/2001 | Gillingham | 714/718 |
| 6,324,657 B1 | * | 11/2001 | Fister et al. | 714/42 |

* cited by examiner

*Primary Examiner*—Robert Beausoleil
*Assistant Examiner*—Marc Duncan

(57) ABSTRACT

A method and apparatus for locating defects in an on-chip memory of an integrated circuit is presented. During a memory test of on-chip memory, a known data value is written to a word in the on-chip memory, and an output data value is read back from the same addressed word in memory. A comparison of the output data value and expected data value is performed within the integrated circuit, producing a comparison result indicating which of the bit cells in the addressed word have failed. The address and comparison result are transferred external to said integrated circuit and correspond to a bitmap entry in a bitmap. The execution of a full memory test results in a complete bitmap indicating all the failed cells of the on-chip memory.

23 Claims, 3 Drawing Sheets

ON-THE-FLY MEMORY TESTING AND AUTOMATIC GENERATION OF BITMAPS

FIELD OF THE INVENTION

The present invention pertains generally to semiconductor memory testing, and more particularly to a method and apparatus for testing on-chip RAM and automatically generating a bitmap indicating cell failures.

BACKGROUND OF THE INVENTION

The semiconductor industry continues to yield integrated circuits (ICs) of increasing complexity. To provide increased functionality and performance, many IC's include on-chip memory. On-chip memory may take on a variety of forms, including read-only memory (ROM), programmable read-only memory (PROM), erasable programmable read-only memory (EPROM), flash EPROM (which allow the contents of the memory to be erased and reprogrammed on the fly), and random access memory (RAM). ROM, including each variety of ROM, is generally implemented using non-volatile memory that retains its programmed contents even when the chip itself is powered down. RAM is typically implemented using volatile memory which, although does not retain its contents when powered down, tends to be faster and consumes less power.

The use of on-chip ROM, regardless of variety, allows more generalized functionality to be provided within a chip due to the ability to implement and execute a wide variety of functions through software (or, more specifically, firmware) encoded in the memory. Furthermore, the erasable/reprogrammable varieties of ROM allow the functionality of a chip to be altered simply by changing the contents of the memory.

RAM is typically used to temporarily store data used in the calculation of some larger functions. The use of on-chip RAM greatly enhances chip performance because having the memory located physically within the chip itself reduces the data access overhead, and therefore the data access times, which contributes to the improvement of functionality and performance of an integrated circuit.

The trend in integrated circuit reliability is to provide at least some basic testing that is automatically performed by the chip itself upon power up. This type of testing is often termed "built-in self test", or simply "BIST". The function of a BIST is generally to perform a variety of circuit tests that verify the correct functionality of the chip immediately upon power up and before enabling full functionality of the chip. One of the tests typically performed by BIST is on-chip memory testing. Memory testing itself may include a number of tests, each designed to detect memory memory defects (e.g., a stuck bit cell, or a defective word line that causes an entire row of bit cells to fail) in the on-chip memory. The conditions that are used to detect memory cell defects are a function of the supporting hardware and firmware. When these conditions discover a defect that causes one or more of the memory cells to fail, the locations of the cells that failed as a result of the defect are recorded in what is termed herein as a "bitmap".

Prior art solutions for locating failed memory cells in order to generate a bitmap for an IC required data to be read from the memory and transferred outside of the chip, either via serial methods such as the boundary scan interface for digital ICs of the Joint Test Action Group (JTAG) IEEE 1149.1 standard protocol, or parallel methods such as Direct Access Testing, both of which are well-known in the art. Once available externally, each data bit read out from memory is compared with an expected value of the data bit to determine whether or not a failure has occurred. In order to search an entire memory for various kinds of defects, this procedure is performed multiple times across each memory address, and the locations of all failures in the memory are recorded to generate a bitmap.

Those skilled in the art will appreciate that the prior art methods consume a significant amount of time and involve significant equipment expense and design overhead. Transferring data off-chip is very time-consuming, especially when using serial scan methods and if a bitmap of the entire memory is desired. In addition, expensive IC testers or similar equipment must be used to collect the data and perform the comparison. Furthermore, engineering effort must be spent during the design phase to incorporate the circuits necessary to make the memory data accessible outside the chip. This effort can be considerable, especially if the solution involves making memory data available in real-time.

Accordingly, a need exists for a method and apparatus for allowing automatic on-chip generation of a bitmap that indicates the location of failing cells of an integrated circuit memory.

SUMMARY OF THE INVENTION

The present invention is a novel method and apparatus that makes it possible to detect and locate failing cells in an integrated circuit memory. In accordance with the design of the invention, data coming out of the on-chip memory is compared to its expected value while it is still on-chip. In the event of a comparison mismatch (or failure), the results of the comparison and its corresponding address in memory are stored in registers that may be scanned by external hardware and recorded in a bitmap or stored in another on-chip location for later retrieval.

In accordance with a preferred embodiment of the invention, data coming out of on-chip memory is compared to one of two programmable values stored respectively in a pair of respective expected data registers. The result of the compare is placed in a compare results register. Each comparator outputs a 0 if its inputs are the same and a 1 if its inputs are different. If all of the bits in the compare results register are 0, then the data read from memory is the same as the data in the selected expected data register. Conversely, a 1 in the compare results register indicates that memory data does not agree with the selected expected data register. The location of the 1 in the compare results register corresponds to the location of the incorrect memory bit. The outputs of each of the comparators are logically OR'ed together to generate a fault indicator that indicates whether a mismatch occurred in the currently output addressed word in memory. The fault indicator may be used to halt the memory test long enough to scan the contents of the compare results register and obtain the address in memory that resulted in the fault indication. Once the address and its corresponding comparison results are scanned out and recorded in a bitmap, the memory test may be resumed to continue the process until the entire memory has been tested. Upon completion of the memory test, a bitmap of the failed cells for the entire memory has been recorded. The use of two expected data registers are particularly advantageous when executing conventional March tests which systematically fill the memory with one of two alternating values.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A method and apparatus that supports the detection and location of defects in an integrated circuit memory is described in detail hereinafter.

Figure 1:
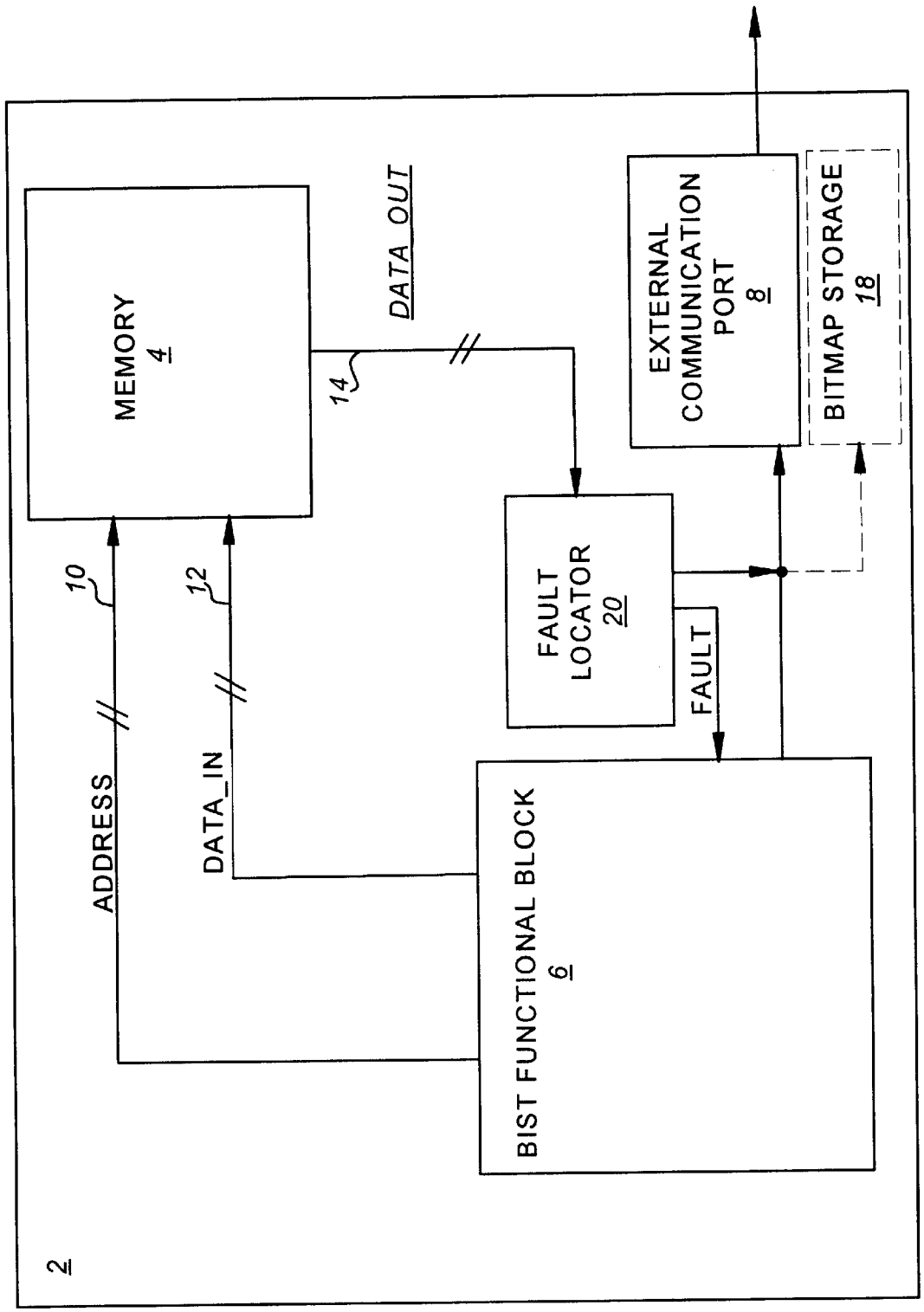
FIG. 1 is a block diagram of an integrated circuit that includes the apparatus of the invention.

FIG. 1 is a block diagram of an integrated circuit (IC) 2 that contains the apparatus of the invention. IC 2 includes memory 4, built-in self test (BIST) functional block 6, and communication port 8. Memory 4 receives input data on DATA_IN lines 12 to be written to memory cells addressed by 20 addresses received on ADDRESS lines 10. Data is read out of memory 4 on DATA_OUT lines 14.

BIST functional block 6 is hardware, firmware, or a combination of both, that controls the execution of on-chip memory tests that are designed to detect and locate defects in memory 4. The general operation of each BIST memory test involves performing a series of writes via data input lines DATA_IN 12 and reads via data output lines DATA_OUT to and from an addressed location indicated on ADDRESS lines 10 in memory 4. At various points in the test, the contents of the addressed location are read and compared to an expected value for the location at that point in the test. A fault locator 20 residing within IC 2 performs the comparison between the contents that are read (via data output lines DATA_OUT) and the corresponding expected value. A mismatch between the contents of the addressed location and the expected value indicates a memory defect that corrupts the cell(s) that map to the mismatching bit(s) of the addressed word. Communication port 8 is used to send mismatch address and comparison result pairs off-chip for storage as comparison mismatches are detected. Alternatively, the comparison mismatch information is stored in a bitmap storage 18 located on-chip for later retrieval by external hardware. The accumulated mismatch pairs at the end of the test comprise a complete bitmap of the precise location of failed cells in memory 4 that were detected by the particular memory test executed by BIST functional block 6.

It will be appreciated that an important advantage provided by the invention is that the comparisons are performed entirely on-chip. This provides a significant improvement over the prior art, where the read-back contents of the memory cells had to be transferred off-chip to perform the comparison, in terms of both performance (data access and test execution time) and external equipment overhead.

Figure 2:
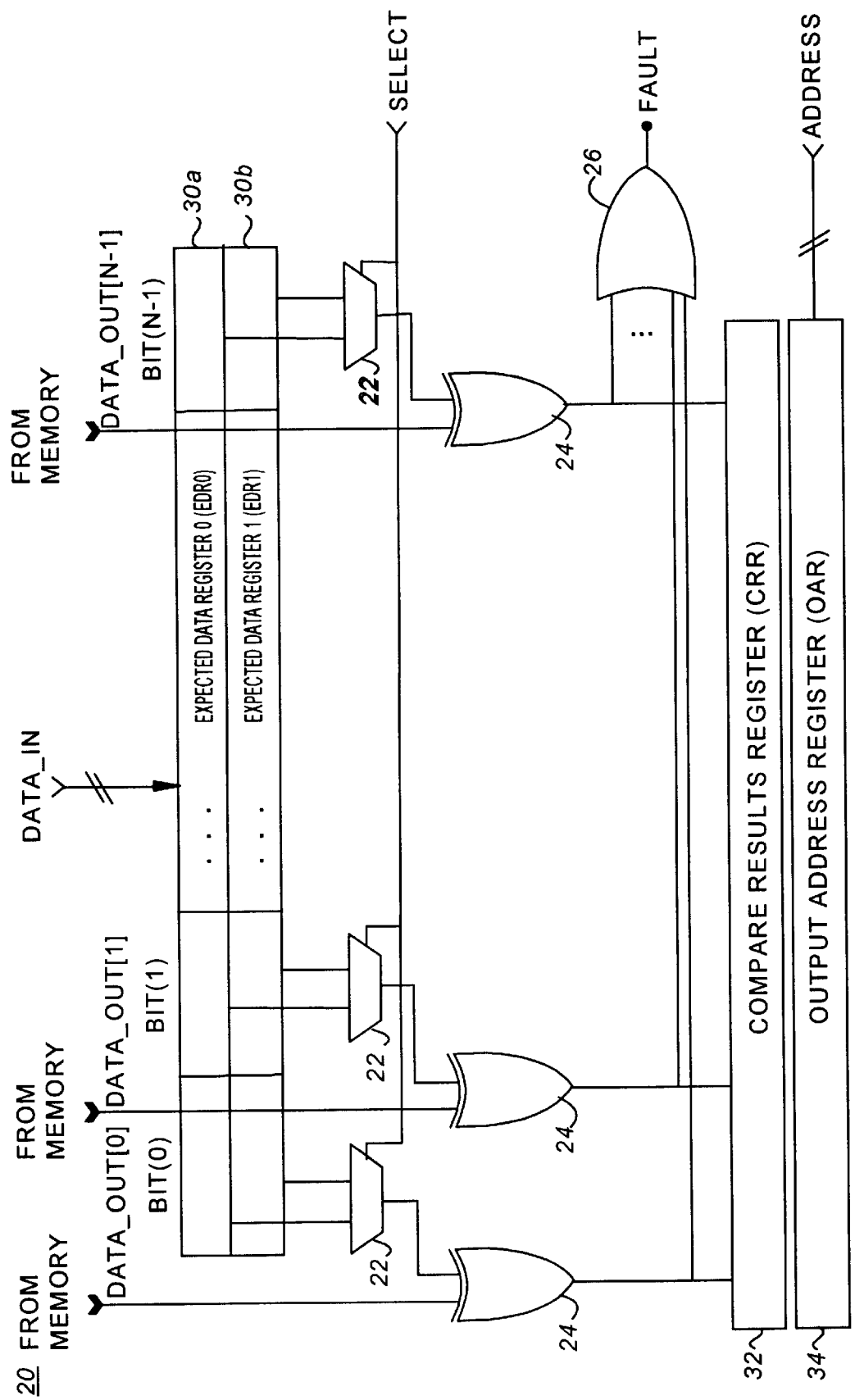
FIG. 2 is a schematic block diagram illustrating one embodiment of an apparatus in accordance with the invention.

FIG. 2 is a schematic block diagram illustrating one embodiment of the fault locator 20 apparatus of the invention. Preferably, fault locator 20 includes a pair of expected data registers EDR0 30a and EDR1 30b that are programmable by the BIST function block 6 or through diagnostic instructions received via external pins (not shown) of IC 2. Each expected data register EDR0 30a, EDR1 30b holds a word comprising N bits (BIT(0:N−1)). Fault locator 20 includes N multiplexers 22, one for each bit of the word, each controlled by a select line SELECT to output the contents of its respective bit from one or the other of expected data register EDR0 30a or EDR1 30b. N comparators 24, one each corresponding to each bit in the word, compare the data DATA_OUT[0:N−1] coming out of the memory 4 to the respective bit value BIT(0:N−1) output from its associated multiplexer 22. In the illustrative embodiment, each comparator 24 is implemented using an exclusive-OR logic gate. Each comparator 24 outputs a binary 0 if its inputs are the same and a binary 1 if its inputs are different. A compare results register CRR 32 receives the bitwise output compare results from each of comparators 24. If all of the bits in the CRR 32 are 0, then the data DATA_OUT[0:N−1] read from memory 4 is the same as the data in the selected expected data register EDR0 30a or EDR1 30b. Conversely, a 1 in the compare results register CRR 32 indicates that data DATA_OUT[0:N−1] read from memory 4 does not agree with the selected expected data register EDR0 30a or EDR1 30b. Each bit CRR[0:N−1] in compare results register CRR 32 maps positionally to one bit BIT(0:N−1) in the addressed word represented by output data DATA_OUT[0:N−1]. Accordingly, the location of a bit CRR[0:N−1] having a value of 1 in the compare results register CRR 32 corresponds to the location of the bit BIT(0:N−1) of a failed cell located at the address in memory 4 as defined by the contents of output address register OAR 34.

It will be appreciated that more than one cell in the addressed memory may fail, and therefore multiple 1's may exist in the compare results register CRR 32. If so, each CRR 32 bit of value "1" corresponds to a bit position for which the contents of memory 4 at the address contained in output address register OAR 34 and the expected value contained in the selected expected data register EDR0 30a or EDR1 30b do not agree.

A fault indicator 26 provides a fault indication FAULT when any of the N comparators 24 indicates a mismatch. In the illustrative embodiment, fault indicator 26 is implemented using an N-input OR gate that receives the outputs of each of the N comparators 24 and outputs a 0 when all of its inputs are 0 and a 1 otherwise. Accordingly, the output FAULT of OR gate 26 is logically true, indicated by binary 1, when the contents of memory 4 at the addressed location indicated by the contents of output address register OAR 34 and expected data value in the selected EDR do not agree. The firmware implemented in BIST functional block 6 can be set up so that a sequence of memory reads will halt when FAULT becomes a 1.

Preferably, each of the registers in FIG. 2, including EDR0 30a, EDR1 30b, CRR 32 and OAR 34, can be written to or read from using either diagnostic instructions received through external instruction pins (not shown) of IC 2, encoded in the firmware of BIST functional block 6, downloaded into an instruction cache, or via scan techniques. Accordingly, the registers EDR0 30a, EDR1 30b, and the memory address 10 can be programmed and the memory data on DATA_OUT lines compared to expected data contained in EDR0 30a or EDR1 30b in any way the user chooses. The SELECT line can be controlled by the BIST functional block 6 in a way which then allows the entire memory 4 to be read and checked without any user intervention.

If a failed cell is detected, that is, if any bit DATA_OUT [0:N−1] from memory 4 is read that does not match the expected data contained in the selected EDR 30a or 30b, the FAULT signal becomes 1 and the memory testing is paused. Alternatively, the address/comparison results pair is stored in a bitmap storage area 18 located on the chip. The bits in CRR 32 that are set correspond directly to the location of the failing memory cells at the address in the OAR 34. Then, the address as stored in address register OAR 34 and its corresponding comparison results contained in CRR 32 are read either through diagnostic instructions or through scan techniques using communication port 8. Once the OAR 34 and CRR 32 contents are retrieved or stored, the memory test is resumed and the process repeated until the entire memory is tested. The accumulated scanned results, or the contents of the bitmap storage 18, at the end of the test correspond to a bitmap of the precise location of detected failed memory cells.

In order to make the entire process as simple as possible, the two EDRs 30a and 30b are preferably used as the source for writing data to the memory. This works especially well with the well-known March tests, which, as known by those skilled in the art, systematically fill the memory with one of two alternating data patterns.

Figure 3:
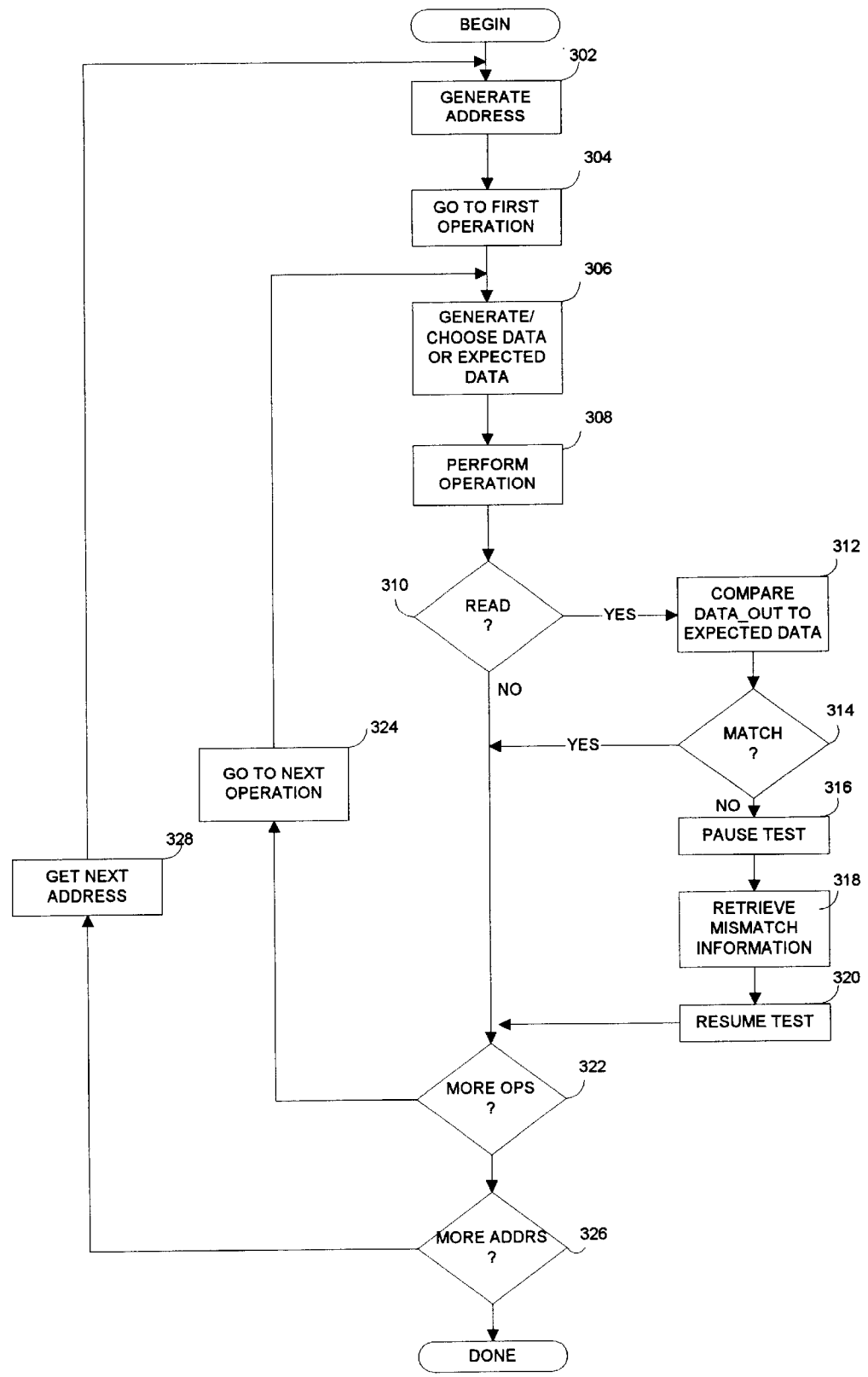
FIG. 3 is flowchart of a method in accordance with the invention.

FIG. 3 is a flowchart illustrating one embodiment of the method of the invention. In a step 302, BIST functional block 6 generates an address. BIST functional block 6 performs a series of operations at each address generated. The first operation to be performed is obtained in step 304. For each operation, in step 306, BIST functional block 6 either generates or chooses input data, or generates or chooses expected data corresponding to the data previously written to the address generated in step 302. In step 308, if the current operation is a write operation, the input data is written to memory 4 on data input lines DATA_IN 12 at the address generated in step 302 on address lines ADDRESS 10. If the current operation is a read operation, the contents of memory 4 at the address generated in step 302 are read out on data output lines DATA_OUT 14. In step 310 a determination is made whether the current operation is a write or a read. If the current operation is a read, fault locator 20 compares the output data read on lines DATA_OUT 14 with the expected data in step 312. A determination is made in step 314 as to whether the output data and expected data match. If a mismatch occurs, the test is paused in step 316 to allow the mismatch information to be retrieved in step 318. After the mismatch is retrieved, either for example via external communication port 8 or by storing the mismatch information in another storage area on the chip 2, the memory test is resumed in step 320.

Upon resuming the test, or if it is determined in step 314 that the output data matches the expected data or if in step 310 it is determined that the current operation is a write operation, a determination is made in step 322 as to whether more operations in the memory test exist. If more operations exist, the next operation is obtained in step 324, and steps 306 through 322 are repeated until no more operations exist for the current address.

If no more operations exist for the current address, a determination is made in step 326 as to whether more memory addresses are to be tested. If more addresses are to be tested, the current address is updated to the next address in step 328 and steps 302 through 326 are repeated. If no more addresses exist to be tested, the method is complete, and the resulting bitmap obtainable by the memory test is complete. The details of the memory test itself may vary from application to application; however, the comparison is always performed on-chip.

It will be appreciated by those skilled in the art that the invention described herein provides several advantages. First, because the data is examined in real-time, the memory is operating at full speed as the data is checked for correctness. If an error is detected, then the memory test only needs to pause if the location of the failure is desired, and only for long enough to read the registers. In addition, because the hardware shown in FIG. 2 exists for each memory block on the chip, it is possible to perform tests, including bitmaps, on the entire memory system concurrently. This is a big advantage with on-chip caches because of the large number of bits that can be accessed in parallel. Accordingly, the present invention offers a very time-efficient technique for detecting and locating memory cell failures.

Secondly, the present invention has the advantage of requiring only a small amount of equipment to test the memory. It is possible to perform memory tests including bitmaps through diagnostic instructions alone. Thus, no special test equipment is required. If scan techniques are employed to program and read the registers, then the only equipment requirement is a device to provide the serialized I/O, such as a JTAG interface box.

The use of scan techniques provides yet another advantage, which is the ability to test an on-chip cache independently of the CPU. This can be very useful when turning on a microprocessor and its on-chip cache for the first time.

Finally, since the data is stored on-chip, there is no need to generate expected data vectors or write software to perform comparisons between these vectors and the data coming out of memory.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An apparatus for locating defects in an on-chip memory of an integrated circuit, comprising:
    an on-chip address generator which generates an address and stores said address in an address register;
    an on-chip data generator which generates an expected data value and stores said expected data value in an expected data register;
    an on-chip processor which writes said expected data value from said expected data register to said address indicated in said address register in said on-chip memory and reads an output data value from said address indicated in said address register in said on-chip memory; and
    an on-chip fault detector operable to compare said output data value and said expected data value indicated in said expected data register, to generate a bitwise comparison result indicating which, if any, of a plurality of bit cells at said address have failed, and if any of said plurality of bit cells at said address have failed, to store said bitwise comparison result in a compare result register for retrieval by an external source.

2. An apparatus in accordance with claim 1, comprising:
    a communication port operable to transfer said address and said corresponding comparison result external to said integrated circuit.

3. An apparatus in accordance with claim 1, comprising:
    a fault indicator which generates a fault signal if said comparison result indicates that any of said plurality of bit cells at said address have failed.

4. An apparatus in accordance with claim 3, comprising:
    a communication port operable to transfer said address and said corresponding comparison result external to said integrated circuit upon the occurrence of a fault signal.

5. An apparatus in accordance with claim 3, wherein:

said on-chip fault detector comprises:

a comparator which receives said data output value and said expected data value and performs a bitwise comparison of said data output value to said expected data value to generate said comparison result.

6. An apparatus in accordance with claim 1, comprising:

a memory test generator for generating said address and said corresponding expected data value, writing said expected data value to said address, and reading said output data value from said address.

7. An apparatus in accordance with claim 1, comprising:

on-chip bitmap storage for storing said address and said bitwise comparison result if any of said plurality of bit cells at said address have failed.

8. An apparatus in accordance with claim 7, comprising:

a communication port operable to transfer said address and said bitwise comparison result from said on-chip bitmap storage to external to said integrated circuit.

9. An apparatus for locating defects in an on-chip memory of an integrated circuit, comprising:

an address register for storing an address, generated in said integrated circuit, of a word in said memory, said word comprising a plurality of bit cells;

an expected data register for storing an expected data value generated in said integrated circuit and written to said word in said memory;

an on-chip comparator operable to receive an output data value read from said word in said memory, and to compare said output data value and said expected data value to generate a comparison result indicating which of said plurality of bit cells in said word have failed; and a compare result register for storing said comparison result generated by said on-chip comparator for retrieval by an external source.

10. An apparatus in accordance with claim 9, comprising:

a communication port operable to transfer said address from said address register and said comparison result from said compare result register external to said integrated circuit.

11. An apparatus in accordance with claim 9, comprising:

a fault indicator which generates a fault signal if said comparison result indicates that any of said plurality of bit cells in said word have failed.

12. An apparatus in accordance with claim 11, comprising:

a communication port operable to transfer said address from said address register and said comparison result from said compare result register external to said integrated circuit upon the occurrence of a fault signal.

13. An apparatus in accordance with claim 9, comprising:

an on-chip memory test generator for generating said address and said corresponding expected data value, and writing said expected data value to said word in said memory located at said address.

14. An apparatus in accordance with claim 9, comprising:

on-chip bitmap storage for storing said address and said bitwise comparison result if any of said plurality of bit cells in said word have failed.

15. An apparatus in accordance with claim 14, comprising:

a communication port operable to transfer said address and said bitwise comparison result from said on-chip bitmap storage to external to said integrated circuit.

16. A method for locating defects in an on-chip memory of an integrated circuit, comprising:

generating in said integrated circuit an address in said on-chip memory;

storing said address in an address register;

generating in said integrated circuit an expected data value;

storing said expected data value in an expected data register;

writing said expected data value indicated in said expected data register to said address in said on-chip memory;

reading an output data value from said address indicated in said address register in said on-chip memory;

performing an on-chip comparison of said output data value and said expected data value indicated in said expected data register; and producing a bitwise comparison result indicating which, if any, of a plurality of bit cells at said address indicated in said expected data register have failed; and if any of said plurality of bit cells at said address indicated in said expected data register have failed, storing said bitwise comparison result in a compare results register for retrieval by an external source.

17. A method in accordance with claim 16, comprising:

transferring said address and said comparison result external to said integrated circuit.

18. A method in accordance with claim 17, comprising:

repeating said first generating step through said transferring steps.

19. A method in accordance with claim 16, comprising:

generating a fault signal if any of said plurality of bit cells at said address have failed.

20. A method in accordance with claim 19, comprising:

transferring said address and said comparison result external to said integrated circuit upon the occurrence of said fault signal.

21. A method in accordance with claim 20, comprising:

repeating said first generating step through said producing step.

22. A method in accordance with claim 16, comprising:

if any of said plurality of bit cells at said address have failed, transferring said address and said bitwise comparison result to on-chip bitmap storage.

23. A method in accordance with claim 22, comprising:

transferring said address and said bitwise comparison result from said on-chip bitmap storage external to said integrated circuit.

* * * * *